United States Patent
Carter et al.

[11] Patent Number: 6,093,636
[45] Date of Patent: Jul. 25, 2000

[54] PROCESS FOR MANUFACTURE OF INTEGRATED CIRCUIT DEVICE USING A MATRIX COMPRISING POROUS HIGH TEMPERATURE THERMOSETS

[75] Inventors: Kenneth Raymond Carter; Daniel Joseph Dawson, both of San Jose; Craig Jon Hawker, Los Gatos; James Lupton Hedrick, Pleasanton, all of Calif.; Jeffrey Curtis Hedrick, Park Ridge, N.J.; Victor YeeWay Lee, San Jose, Calif.; Robert Dennis Miller, San Jose, Calif.; Willi Volksen, San Jose, Calif.; Do Yeung Yoon, Los Gatos, Calif.

[73] Assignee: International Business Machines Corporation, Armonk, N.Y.

[21] Appl. No.: 09/111,808

[22] Filed: Jul. 8, 1998

[51] Int. Cl.[7] ...................... H01L 21/4763; H01L 21/469
[52] U.S. Cl. .......................... 438/623; 438/781; 438/622; 438/763; 438/780
[58] Field of Search .................................... 438/623, 781, 438/622, 763, 780

[56] References Cited

U.S. PATENT DOCUMENTS

| | | | |
|---|---|---|---|
| 3,547,839 | 12/1970 | Tocker | 260/2.5 |
| 3,732,181 | 5/1973 | Ray et al. | 260/41 B |
| 3,900,320 | 8/1975 | Rolker et al. | 96/35.1 |
| 3,917,761 | 11/1975 | Scheuerlein et al. | 264/41 |
| 4,141,877 | 2/1979 | Luttinger et al. | 260/37 EP |
| 4,457,972 | 7/1984 | Griffith et al. | 428/334 |
| 4,535,099 | 8/1985 | Lee et al. | 521/154 |
| 4,623,463 | 11/1986 | Ford et al. | 210/500.29 |
| 4,761,233 | 8/1988 | Linder et al. | 210/500.37 |
| 4,920,402 | 4/1990 | Nakaya et al. | 357/68 |
| 5,036,145 | 7/1991 | Echterling et al. | 525/431 |
| 5,043,369 | 8/1991 | Bahn et al. | 523/466 |
| 5,114,826 | 5/1992 | Kwong et al. | 430/192 |
| 5,130,025 | 7/1992 | Lefebvre et al. | 210/638 |
| 5,183,607 | 2/1993 | Beall et al. | 264/41 |
| 5,188,777 | 2/1993 | Joesten et al. | 264/41 |
| 5,198,203 | 3/1993 | Kresge et al. | 423/718 |

(List continued on next page.)

FOREIGN PATENT DOCUMENTS

| | | |
|---|---|---|
| 0 755 957 A1 | 1/1997 | European Pat. Off. . |
| 0 524 930 B1 | 3/1997 | European Pat. Off. . |
| 63-172741 | 7/1988 | Japan . |
| 63-278943 | 11/1988 | Japan . |
| 05205526 | 8/1993 | Japan . |
| 2 006 643 | 5/1979 | United Kingdom . |
| WO 97/01593 | 1/1997 | WIPO . |
| WO 97/10193 | 3/1997 | WIPO . |

OTHER PUBLICATIONS

Allen, G. et al., *Comprehensive Polymer Science. The Synthesis, Characterization, Reactions & Applications of Polymers*, vol. 1, pp. 17–18 and 34–37, Pergamon Press (Date Unknown).

Allen, G. et al., *Comprehensive Polymer Science. The Synthesis, Characterization, Reactions & Applications of Polymers*, vol. 3, pp. 34–37, Pergamon Press (Date Unknown).

(List continued on next page.)

*Primary Examiner*—Wael Fahmy
*Assistant Examiner*—Neal Berezny
*Attorney, Agent, or Firm*—Scully, Scott, Murphy, & Presser; Daniel P. Morris

[57] ABSTRACT

The invention relates to a process for forming an integrated circuit device comprising (i) a substrate; (ii) metallic circuit lines positioned on the substrate and (iii) a dielectric material positioned on the circuit lines. The dielectric material comprises porous organic polyarylene ether.

20 Claims, 2 Drawing Sheets

U.S. PATENT DOCUMENTS

| | | | |
|---|---|---|---|
| 5,206,337 | 4/1993 | Takeda et al. | 528/313 |
| 5,252,654 | 10/1993 | David et al. | 524/414 |
| 5,288,842 | 2/1994 | Feger et al. | 528/335 |
| 5,304,515 | 4/1994 | Morita et al. | 437/231 |
| 5,384,376 | 1/1995 | Tunney et al. | 525/479 |
| 5,412,016 | 5/1995 | Sharp | 524/430 |
| 5,412,160 | 5/1995 | Yasumoto et al. | 174/258 |
| 5,420,232 | 5/1995 | Dawson et al. | 528/353 |
| 5,461,003 | 10/1995 | Havemann et al. | 437/187 |
| 5,470,801 | 11/1995 | Kapoor et al. | 437/238 |
| 5,498,689 | 3/1996 | Furuta et al. | 528/214 |
| 5,521,424 | 5/1996 | Ueno et al. | 257/632 |
| 5,523,615 | 6/1996 | Cho et al. | 257/632 |
| 5,633,034 | 5/1997 | Carter et al. | 427/96 |
| 5,658,994 | 8/1997 | Burgoyne, Jr. et al. | 525/390 |
| 5,747,381 | 5/1998 | Wu et al. | 438/624 |
| 5,767,014 | 6/1998 | Hawker et al. | 438/623 |
| 5,773,197 | 6/1998 | Carter et al. | 430/313 |
| 5,847,443 | 12/1998 | Cho et al. | 257/632 |

OTHER PUBLICATIONS

*Encyclopedia of Polymer Science and Engineering. Anionic Polymerization to Cationic Polymerization,* "Block Copolymers", 2:324–327, a Wiley–Interscience Publication (Date Unknown).

Fang, T. et al., "Polycyanate Esters: Science and Applications", *Prog. Polym. Sci.,* 20:61–118 (1995).

Frechet, J. et al., "Synthesis and Properties of Dendrimers and Hyperbranched Polymers", *Comprehensive Polymer Science,* Second Supplement, pp. 71–132, Pergamon (Date Unknown).

Gauthier, M. et al., "Uniform Highly Branched Polymers by Anionic Grafting: Arborescent Graft Polymers", *Macromolecules,* 24:4548–4553 (1991).

Tian, D. et al., "Ring–Opening Polymerization of 1,4,8–Trioxaspiro[4,6]–9–undecanone: A New Route to Aliphatic Polyesters Bearing Functional Pendent Groups", *Macromolecules,* 30:406–409 (1997).

Tomalia, D. et al., "Comb–Burst Dendrimer Topology. New Macromolecular Architecture Derived from Dendritic Grafting", *Macromolecules,* 24:1435–1438 (1991).

Tomalia, D. et al., "Genealogically Directed Synthesis: Starburst/Cascade Dendrimers and Hyperbranched Structures", *Topics in Current Chemistry,* 165:193–313 (1993).

Babich, E. et al., "Low Viscosity and High Temperature Stable Gap Filling Material for Glass/Ceramic Substrates", *IBM Technical Disclosure Bulletin,* 37(7):595–597 (Jul. 1994).

Chujo, Y., "Organic/Inorganic Polymer Hybrids", *Polymeric Materials Encyclopedia,* 6:4793–4798 (1996).

Chujo, Y. et al., "Organic Polymer Hybrids with Silica Gel Formed by Means of the Sol–Gel Method", *Advances in Polymer Science,* 100:11–29 (Feb. 25, 1991).

Hedrick, J., "Poly(aryl ether benzothiazoles)", *Macromolecules,* 24:6361–6364 (1991).

Hilborn, J. et al., "Poly(aryl ether–benzoxazoles)", *Macromolecules,* 23(11):2854–2861 (1990).

Homma, T. et al., "Stability of a new Polyimide Siloxane Film as Interlayer Dielectrics of ULSI Multilevel Interconnections", *Thin Solid Films,* 235:80–85 (1993).

Joseph, W. et al., "Synthesis of Bis–A Based Polybenzoxazoles via Acid–Catalyzed Solution Cyclization", *Polymer Reprints,* 33(1):501–502 (Apr. 1992).

Joseph, W. et al., "Synthesis of 4,4'–Isopropylidene Diphenol (Bisphenol A) Based Polybenzoxazoles via an Acid–Catalysed Solution Cyclization Process", *Polymer,* 34(4) (1993).

Joseph, W. et al., "Synthesis and Characterization of Fluorinated Polybenzoxazoles via Solution Cyclization Techniques", *Polymer Preprints,* 34(1):397–398 (Mar. 1993).

Joseph, W. et al., "Synthesis and Characterization of Fluorinated Polybenzoxazoles via Solution Cyclization Techniques", *Polymer,* 35(23):5046–5050 (1994).

Mascia, L., "Developments in Organic–Inorganic Polymeric Hybrids: Ceramers", *Trends in Polymer Science,* 3(2):61–66 (Feb. 1996).

McDermott, C., "Foamed Thermoset and Thermoplastic Polymer Combinations", *IBM Technical Disclosure Bulletin,* 8(12):1702 (May 1966).

Morikawa, A. et al., "Preparation of a New Class of Polyimide–Silica Hybrid Films by Sol–Gel Process", *Polymer Journal,* 24(1):107–113 (1992).

Morikawa, A. et al., "Preparation of New Polyimide–Silica Hybrid Materials via the Sol–Gel Process", *J. Mater. Chem.,* 2(7):679–689 (1992).

Munroe, R., "Method for Curing and Holding Semiconductors for Organic Encapsulation", *IBM Technical Disclosure Bulletin,* 27(7A):4037–4038 (Dec. 1984).

Saegusa, T. et al., "An Organic/Inorganic Hybrid Polymer", *J. Macromol. Sci. Chem.,* A27:(13 & 14):1603–1612 (1990).

Volksen, W., "Condensation Polyimides: Synthesis, Solution Behavior, and Imidization Characteristics", *Advances in Polymer Science,* 117:138–139, 163 (1994).

Volksen, W. et al., "Polyamic Alkyl Esters: Versatile Polyimide Precursors for Improved Dielectric Coatings", *IEEE Transactions on Components, Hybrids and Manufacturing Technology* (IEEE Log No. 9104490) (1992).

PROCESS FOR MANUFACTURE OF INTEGRATED CIRCUIT DEVICE USING A MATRIX COMPRISING POROUS HIGH TEMPERATURE THERMOSETS

FIELD OF THE INVENTION

The invention relates generally to a process for manufacturing an integrated circuit device. More specifically, the invention relates to processes for manufacturing integrated circuit devices using matrices of porous high temperature thermosets.

BACKGROUND OF THE INVENTION

There is a continuing desire in the microelectronics industry to increase the circuit density in multilevel integrated circuit devices e.g., memory and logic chips, thereby increasing their performance and reducing their cost. In order to accomplish this goal, there is a desire to reduce the minimum feature size on the chip e.g., circuit line width, and also to decrease the dielectric constant of the interposed dielectric material to enable closer spacing of circuit lines without increase in crosstalk and capacitive coupling. Further, there is a desire to reduce the dielectric constant of the dielectric materials such as utilized in the back end of the line (BEOL) portion of integrated circuit devices, which contain input/output circuitry, to reduce the requisite drive current and power consumption for the device.

The present dielectric is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by current silicon dioxide.

It is therefore an object of the present invention to provide an improved integrated circuit device comprising an improved dielectric material.

Other objects and advantages will be apparent from the following disclosure.

SUMMARY OF THE INVENTION

The invention relates to a process for forming an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises a porous high temperature thermosetting polymers such as polyimides, polycyanurates, polyarylenes, polyarylene ethers, polybenzazoles, and the like, formed by the process of the present invention. Preferably, the dielectric material has pore sizes less than 500 Å.

For on-chip semiconductor device insulator applications it is imperative that the heterogeneous domains be small with respect to current and future device minimum dimensions (<0.18 µm). This assures that the intrinsically heterogeneous insulators will look homogeneous to each individual device. Since polymers are usually incompatible, blending tends to result in unacceptable macroscopic phase separation. This phase separation can affect domain size. The key features in controlling the domain size in phase-separated polymer mixtures are (i) use of polymers or precursor polymers with functionality capable of interacting with the vitrifying matrix (e.g., dipolar interaction, strong hydrogen bonding, Van der Waals interactions, etc.) (ii) the presence of reactive functionality in the minor component which is incorporated (either transiently or permanently) during vitrification to restrict mobility and (iii) the transient presence of a solvent in the film which mediates the interaction between the components during the curing process.

Nanoporosity has been generated from phase-separated polyimide block copolymers by selective removal of thermally labile blocks. While the principle has been demonstrated, this technique requires the synthesis of complex block copolymers and careful control of the processing conditions so that the glass transition temperature Tg of the linear thermoplastic polyimide is not exceeded during the foaming process. A major problem with this technique is that the modulus drop around the Tg for thermoplastic materials is substantial leading to foam collapse either during processing or in high temperature applications.

This difficulty can be circumvented by the use of thermosetting rather than thermoplastic matrix materials. In the case of polyimides, pendant acetylenic functionality (either internal or as end caps) undergoes further reaction at elevated temperatures. In this manner, low molecular weight end-capped polyimides have been demonstrated to undergo efficient chain extension and insolubilization upon heating to elevated temperatures. The reaction is effective and produces no volatile by-products.

We have developed a new technique for the production of porous organic polymers of controlled pore shape, size and density. The technique involves the use of highly branched aliphatic esters which have recently been used to generate pores within a vitrifying organosilicate matrix. As porogens (i.e., a pore generator), the branched materials have reactive surface functionality which can be partially or completely substituted with derivatives containing reactive functionality such as substituted ethynyl or substituted o-diethynyl groups through reaction (esterification, urethane formation etc.) with aryl appropriately substituted carboxylic esters, isocyanates etc. The surface functionality is necessary to assure incorporation into the vitrifying organic polymer matrix, a feature which restricts mobility and hence restricts the size of the phase-separated domains. Specific examples include but are not limited to, 3,4-diphenylethynyl phenyl acetic and propionic acids; 3,4-phenylethynyl benzoic acids; 3,4-diphenyl ethynyl phenoxy acetic acids; as well as the isocyanato derivatives of such materials and other ethynyl substituents other than phenylethynyl as are available and useful. The extent of surface functionalization can be controlled to insure compatibility with the vitrifying resins.

Although substituted or vinylogous o-diethynyl functionality is preferred, this is not a limiting feature since any groups which are incorporated into the vitrifying matrix are acceptable. The reactive functionality is tailored to the vitrifying matrix selected. Since the includants are ultimately removed, thermal stability of the linkages in the foamed product is not an issue.

One other example of the invention is polyisocyanurates. Polyisocyanurates comprise a class of thermosetting materials that possess excellent mechanical properties, good thermal stability and high use temperatures. These materials are used as matrix resins for composite structures for boards and cards and for thin film dielectric insulators. In this invention, we describe a general methodology to nanoporous polycyanurates. Hydroxy functional branched, hyperbranched, star and dendritic polyesters are chemically incorporated into the uncured cyanate resin forming clear homogeneous solutions. Upon curing, the polyester component phase separates. The level of phase separation of the polyester is limited, due to the chemical incorporation either transiently or otherwise in the cyanate resin. The polyesters are thermally unstable and undergo rapid degradation at elevated temperatures, leaving behind a porous medium.

A more thorough disclosure of the invention is presented in the detailed description which follows and from the accompanying drawings.

DETAILED DESCRIPTION OF THE INVENTION

Figure 1:
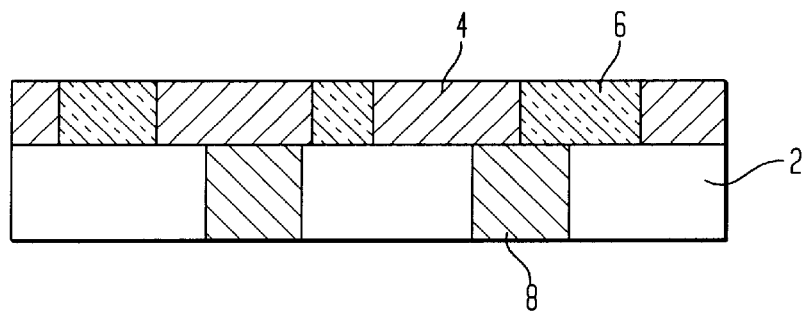
FIG. 1 is a cross-sectional view of a portion of the integrated circuit device formed by the process of the present invention.

An embodiment of the integrated circuit device formed by the process of the present invention is shown in FIG. 1. The device generally comprises substrate 2, metallic circuit lines 4 and dielectric material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the invention comprise silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof. Optionally, the circuit lines may be coated with a metallic liner such as a layer of nickel, tantalum or chromium or other layers such as barrier or adhesion layers (e.g., SiN, TiN).

The key feature of the invention is forming the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises crosslinked porous thermosetting high-temperature polymers.

The porous thermosetting high temperature polymers (such as polyimides, polyarylenes, polyarylene ethers, polycyanurates, and the like), used in the invention preferably have desirable dielectric properties, are easily synthesized and applied and are miscible at the molecular level prior to curing with the fugitive copolymers with which they are mixed.

One exemplary class of thermosetting polymers is polyarylenes. These polyarylenes may be synthesized from precursors such as ethynyl aromatic compounds of the formula:

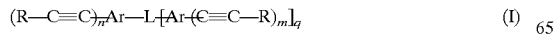
(I)

wherein each Ar is an aromatic group or inertly-substituted aromatic group: each R is independently hydrogen, an alkyl, aryl or inertly-substituted alkyl or aryl group; L is a covalent bond or a group which links one Ar to at least one other Ar; n and m are integers of at least 2; and q is an integer of at least 1. As such, the ethynyl aromatic compounds of the invention have four or more ethynyl groups (for example, tetraethynyl aromatic compounds) and are useful as monomers in the preparation of polymers, including their oligomeric precursors.

In another aspect, the polyarylenes used in the invention may comprise a polymer, including copolymers, which comprise units of:

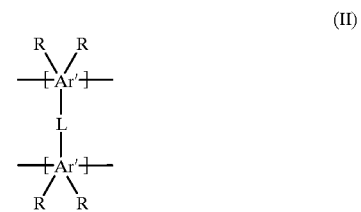
(II)

wherein Ar' is the residual of the reaction of product of $(C\equiv C)_n Ar$ or $Ar (C\equiv C)_m$ moieties and R and L are as defined above.

In one embodiment, the polyarylene copolymers of the invention comprise units of:

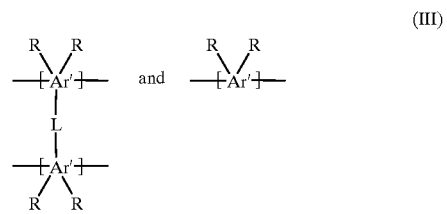
(III)

wherein Ar' and R are as hereinbefore defined.

Representative examples of compounds of the structure of Formula (I) include:

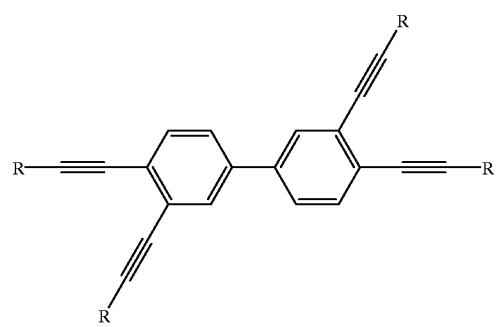

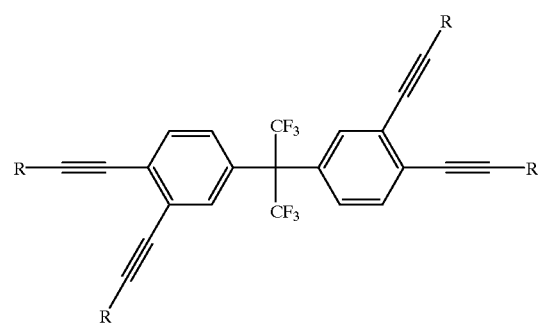

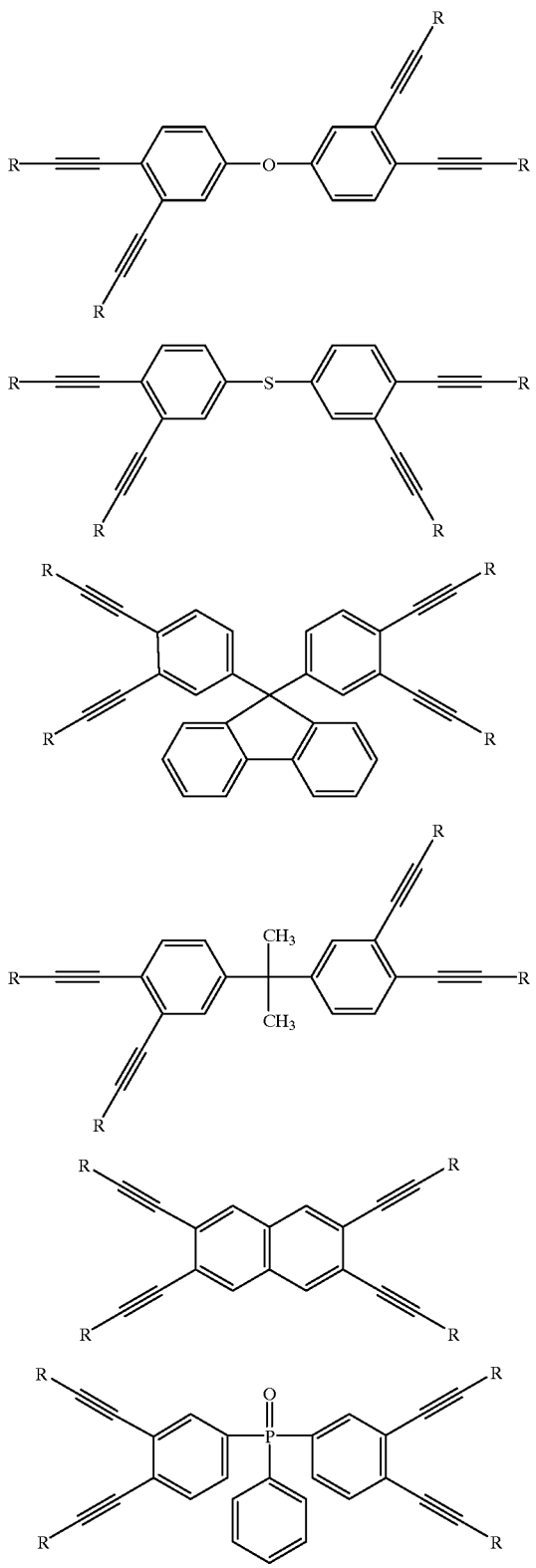

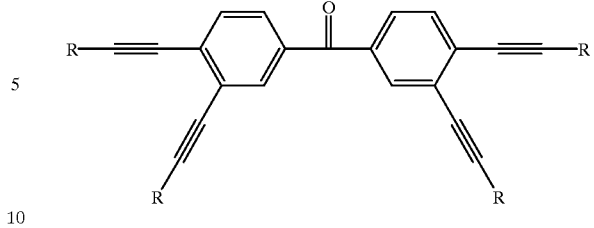

with Ar-L-Ar preferably being biphenyl such as biphenyl; 2,2-diphenyl propane; 9,9'-diphenyl fluorene; 2,2-diphenyl hexafluoro propane; diphenyl sulfide; oxydiphenylene; diphenyl ether; bis(phenylene)diphenylsilane; bis (phenylene) phosphine oxide; bis(phenylene)benzene; bis (phenylene)naphthalene; bis(phenylene)enthracene; thiodiphenylene; 1,1,1-triphenyleneethane; 1,3,5-triphenylenebenzene; 1,3,5-(2-phenylene-2-propyl) benzene; 1,1,1-triphenylenemethane; 1,1,2,2-tetraphenylene-1,2-diphenylethane; bis(1,1-diphenyleneethyl)benzene; 2,2'-diphenylene, 1,1,1,3,3,3-hexafluoropropane; 1,1-diphenylene-1-phenylethane; naphthalene; anthracene; or bis(phenylene)napthacene; more preferably biphenylene; naphthylene; p,p'(2,2-diphenylene propane) ($—C_6H_4—C(CH_3)_2—C_6H_4—$); p,p'-(2,2-diphenylene-1,1,1,3,3,3hexafluoropropene) and ($—C_6H_4—C(CF_3)_2—C_6H_4—$).

Useful bis-phenyl derivatives include 2,2-diphenyl propane; 9,9'-diphenyl fluorene; 2,2-diphenyl hexafluoro propane; diphenyl sulfide; diphenyl ether; bis(phenylene) diphenylsilane; bis(phenylene)phosphine oxide; bis (phenylene)benzene; bis(phenylene)naphthalene; bis (phenylene)anthracene; or bis(phenylene)napthacene.

The ethynyl groups on each Ar are either on adjacent carbon atoms or are vinylogously conjugated within the ring. It is believed that they dimerize upon application of heat to form an aromatic ring having a 1,4-diradical which serves to polymerize and/or cross-link the compound. While not being bound by theory, it is believed that this dimerization occurs via Bergman cyclization such as disclosed by Warner, et al. in *Science*, 268, Aug. 11, 1995, pp. 814–816, which is incorporated herein by reference.

The ethynyl aromatic monomer precursors to thermosetting polyarylenes are preferably bis(o-diethynyl) monomers (herein also referred to as BODA (bis(ortho-diacetylene) monomers)), which means there are at least two sets of adjacent substituted or vinylogously conjugated ethynyl groups on the monomer, that is, at least one set of ethynyl groups on each Ar group. Preferably, the ethynyl aromatic compound contains from 2 to 4, most preferably 2 or 3, diethynyl sets, most preferably, except when additional cross-linking is desired. Two sets (that is, four) of ethynyl groups.

The polyarylene precursor monomers of the invention are advantageously prepared by:

(a) selectively halogenating, preferably in a solvent, a polyphenol (preferably a bisphenol) to selectively halogenate, preferably brominate, each phenolic ring with on e halogen on one of the two positions ortho to the phenolic —OH group;

(b) converting the phenolic —OH on the resulting poly (ortho-halophenol), preferably in a solvent, to a leaving group such as a sulfonate ester (for example, a trifluoromethanesulfonate ester prepared from trifluoromethanesulfonyl halide or trifluoromethane sulfonic acid anhydride) which is reactive with and replaced by terminal ethynyl compounds; and (c) reacting the reaction product of step (b) with an ethynyl-containing compound or an ethynyl synthon in the presence of an aryl ethynylation, preferably palladium, catalyst and an acid acceptor to simultaneously replace the halogen and the trifluoromethylsulfonate with an ethynyl-containing group (for example, acetylene, phenylacetylene, substituted phenylacetylene or substituted acetylene). Further explanation of this synthesis is provided in Babb, published PCT patent application WO 97/10193, published Mar. 20, 1997, which is incorporated herein by reference.

The ethynyl aromatic monomers of Formula (I) are useful to prepare polymers of either Formula (II) or (III). While not being bound by theory, it is believed that the ethynyl groups, specifically those of ortho orientation, on the aromatic ring cyclize upon heating, forming a dehydro aromatic ring which reacts to form a polymer chain. Monomers with more than two ortho ethynyl groups (that is, more than one set of ethynyl groups) are used to form thermoset polymers and depending on the concentration of monomer having more than one set of ortho-ethynyl groups may contain from almost none (that is, a polymer having essentially repeat units of Formula (II) only to substantial segments of linear polymer chain structure (that is, a polymer of Formula (III)).

The ethynyl aromatic monomers can be thermally polymerized. Polymerization can be detected by increasing viscosity or reaction exotherm. Polymerization will generally occur at a temperature more than 150° C., but polymerization temperatures are preferably at least 180° C., more preferably at least 210° C. The polymerization temperature preferably does not exceed that temperature which would result in undesirable degradation of the resulting polymer, which means polymerization is generally conducted at a temperature less than 300° C. for monomers having benzylic hydrogen atoms, and, for monomers not having a benzylic hydrogen, less than 450° C., preferably less than 400° C., more preferably less than 350° C. The polymerization temperature will vary with Ar-L-Ar and R, with smaller R groups like H generally requiring lower temperatures than larger R, and more conjugated Ar and R (when aromatic) groups requiring lower temperatures than less conjugated Ar and R groups. For instance, when R or Ar is anthracene, the polymerization is more advantageously conducted at a lower temperature than when Ar or R is phenyl.

While not being bound by theory, representative units of Formula (II) are believed to have the following structural formulae:

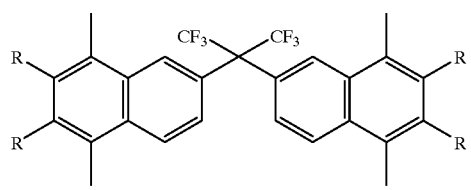

-continued

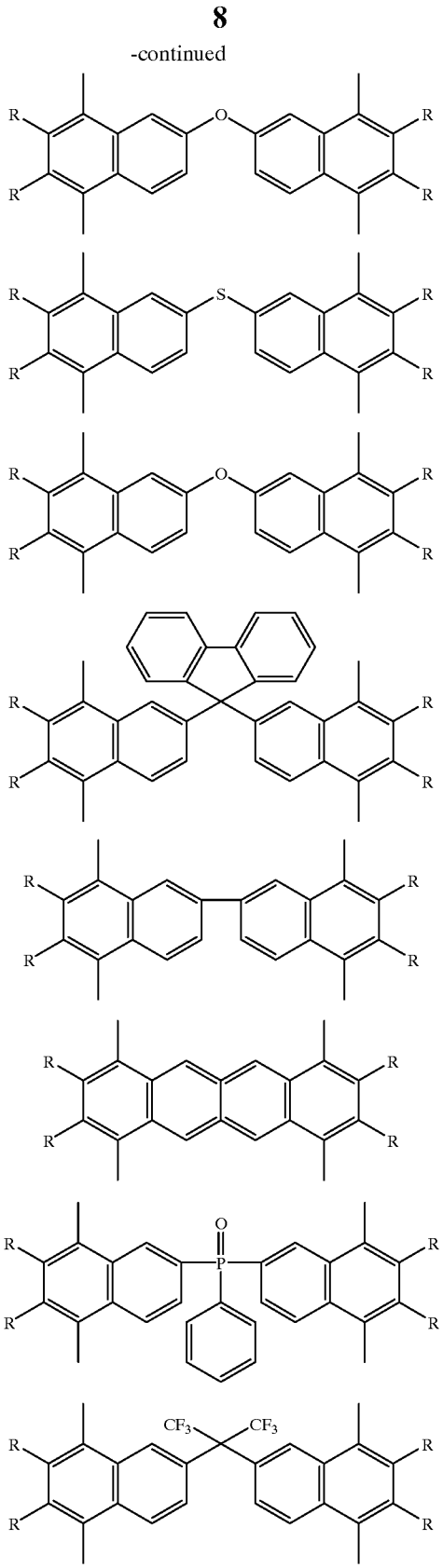

Polymerization is conveniently conducted at atmospheric pressure, but pressures higher or lower than atmospheric pressure can be employed.

The polymerization may be conducted in the presence of agents for controlling (accelerating) the cyclization reaction such as free radical initiators, or the chlorides disclosed by Warner, et al. in Science 269, pp. 814–816 (1995) can be employed in the polymerization reaction.

While not being bound by theory, it is believed that polymerization of the bis(ortho-diacethylene)-6F can be depicted as follows:

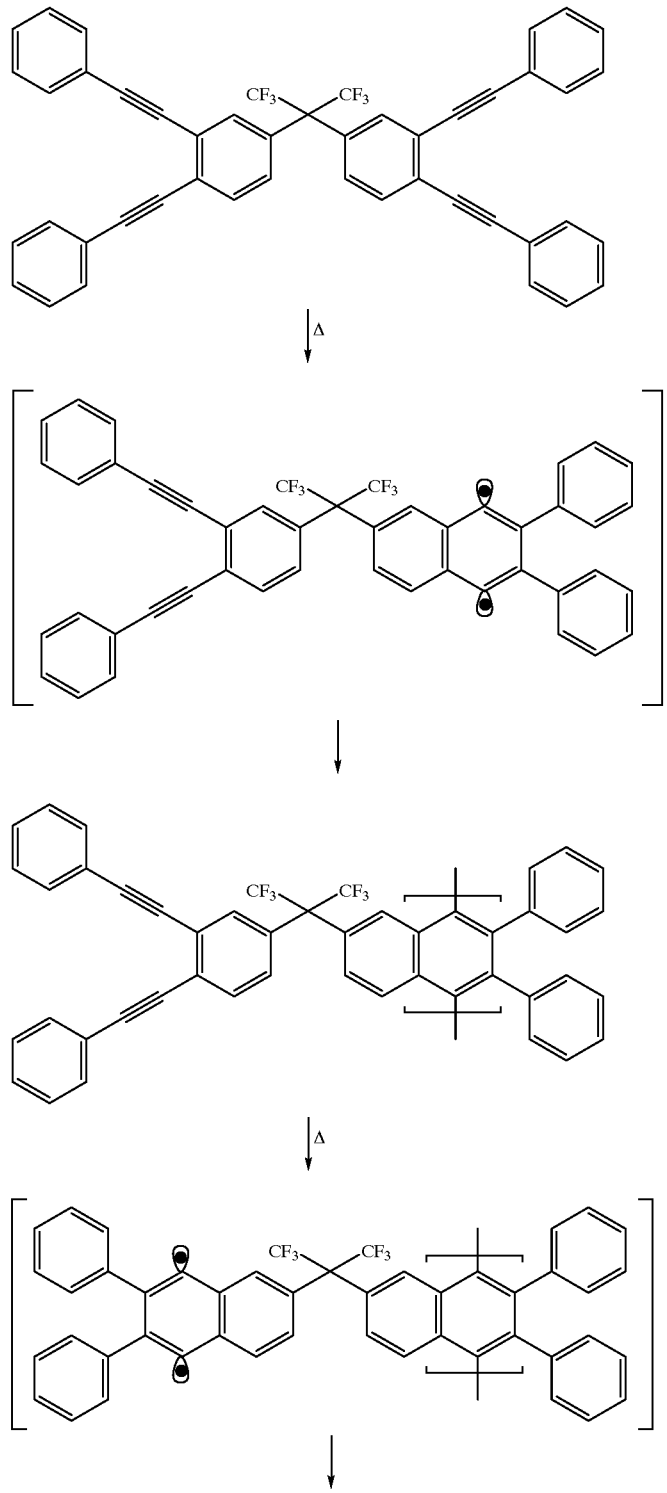

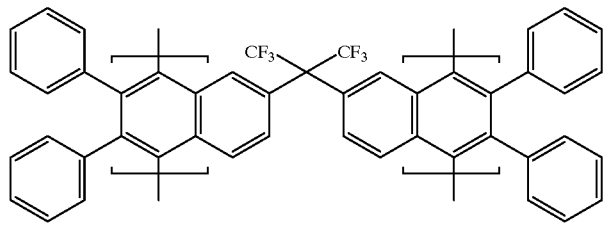

While the specific conditions of polymerization are dependent on a variety of factors including the specific ethynyl aromatic monomer(s) being polymerized and the desired properties of the resulting polymer, in general, the conditions of polymerization are detailed in Babb, published PCT application WO 97/10193 published Mar. 20, 1997, which is incorporated herein by reference.

Further examples of porous polyarylene copolymers may be found in Furuta, et al., U.S. Pat. No. 5,498,689 issued Mar. 12, 1996, which is incorporated herein by reference. Other thermosetting matrices which are useful in the invention include polyarylene ethers, polyimides, and polybenzazoles among others such as those disclosed in PCT application WO 97/01593 published Mar. 20, 1997; Burgoyne Jr. et al, U.S. Pat. No. 5,658,994, issued Aug. 19, 1997; Sovish, European Patent Specification No. 524,930, published Mar. 12, 1997; Burgoyne, European Patent Application No. 755, 957, published Jan. 29, 1997, all of which are incorporated herein by reference.

Another useful class of thermosets include those thermosets which can be used to make nanoporous cyanate networks. In this instance, the cyanate resin is polymerized to form a vitrified network in the presence of a reactive polymer based on templated polymerization.

For example, a poly(ε-caprolactone) with a 6 arm star molecule architecture (V) prepared as shown below was used to modify the bisphenol-A-cyanate (bpacy) shown below (IV). Once melted, the bpacy dissolved the polymer template without the use of a mutual solvent. The use of a solvent to mediate deposition is useful. The miscibility of the two components at the early stages of the cure precludes phase separation with solvent evaporation. As the cyanate resin cures and builds in molecular weight, it is no longer a solvent for the polyester and expels the polymer. However, the phase separation is limited since the star polymer is chemically incorporated either transiently or permanently. Upon vitrification of the cyanate (250° C. cure for 2 hours), the polymer template can be decomposed at ~350° C., leaving behind pores the same size and shape of which are identical to the initial hybrid morphology.

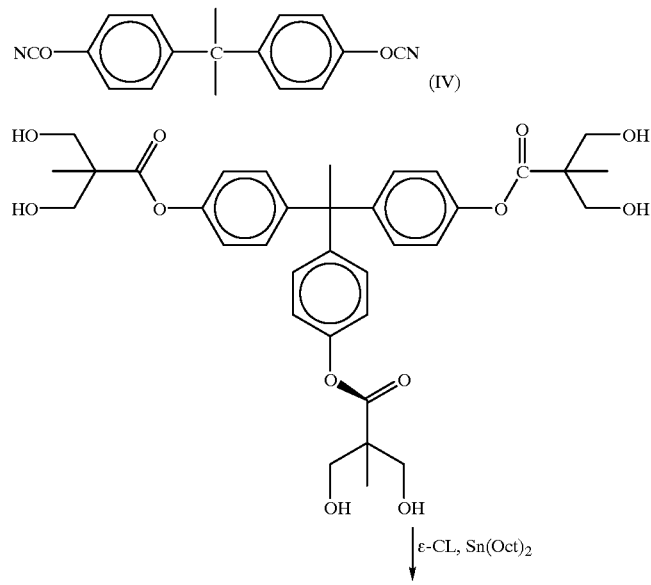

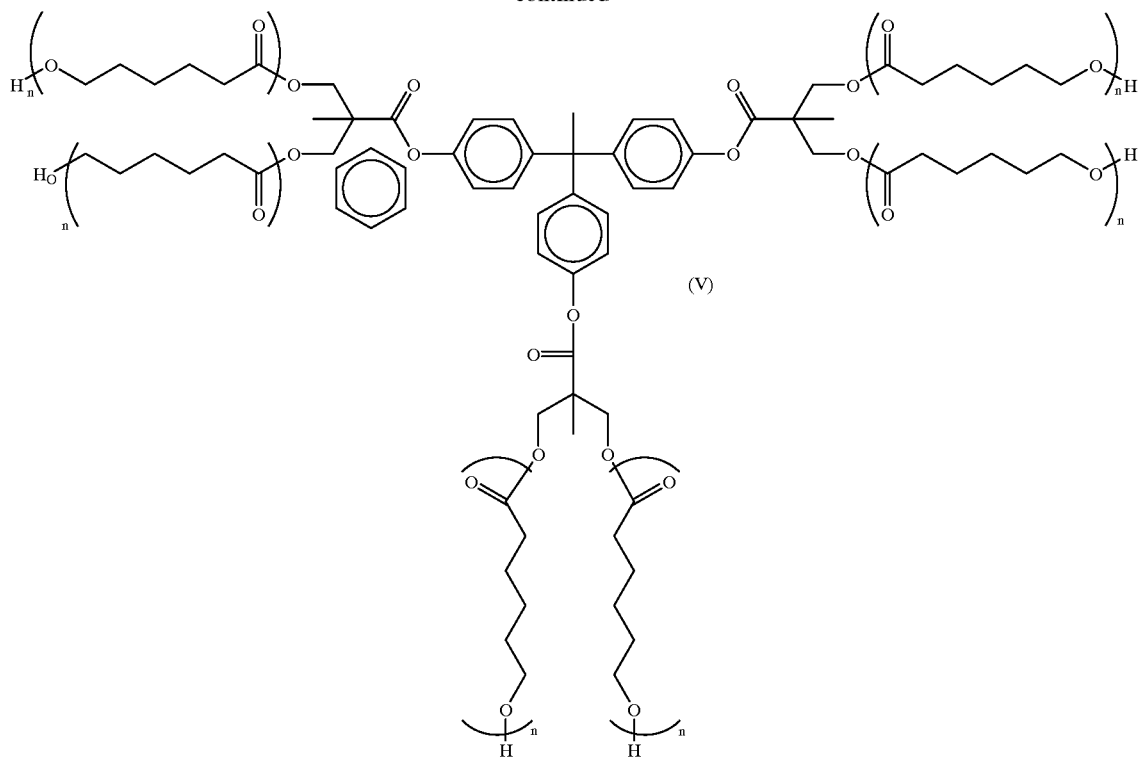

(V)

Polyisocyanurate resins are high performance polymers and play an important role as insulating materials and structural resins in manufacturing microelectronic devices and components. The material requirements for these applications generally include high thermal and dimensional stability, low thermal expansion coefficient and low dielectric constant. A low dielectric constant is of particular importance since propagation delay of electronic signals varies with the inverse of the square root of the dielectric constant and allows for denser wiring at acceptable cross-talk levels. Highly crosslinked networks possess many of the requisite properties for these applications, and epoxy resins are among the most commonly used thermosetting polymers due to their cost, availability and ease of processing.

Cyanate ester resins, an emerging class of high performance thermosetting polymers, have a low dielectric constant (about 2.6 to 3.2), a high Tg and thermal stabilities. However, due to the highly crosslinked structure, they are inherently brittle, limiting their utility in applications requiring high mechanical strength or thermal cycle resistance.

Generally, polyisocyanurates are synthesized from cyanate esters. The unique chemistry of —OCN functionality and the aryl polycyanurate network formed after cure creates distinctive features, which can be further enhanced by altering the polyphenolic backbone structures. Representative monomers useful in making the polyisocyanurates of the invention include those provided below.

POLYCYANATE MONOMER

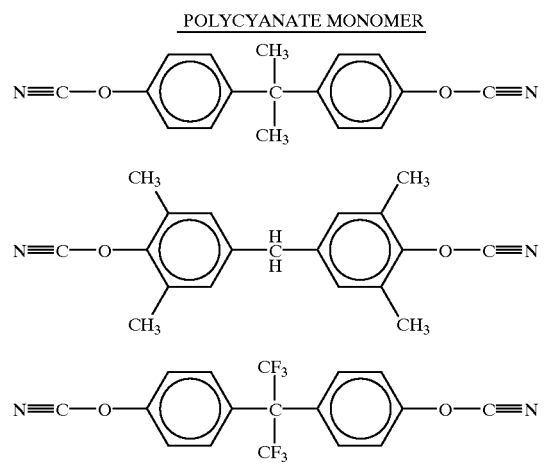

-continued

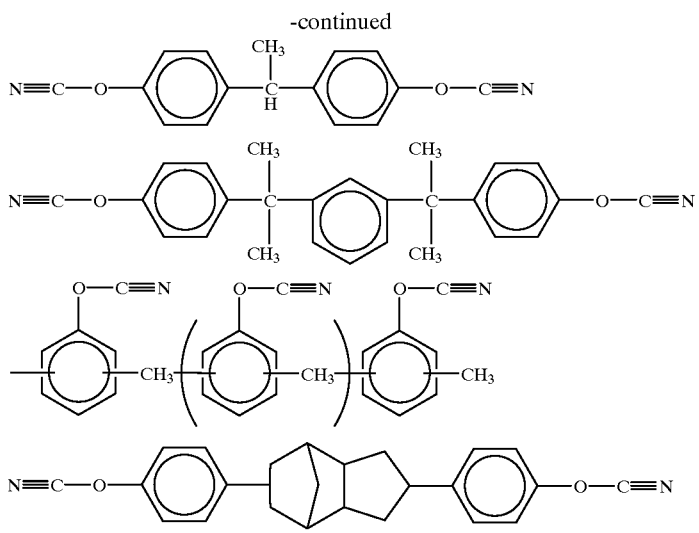

Preparation of the cyanate esters involves adding a base (e.g. triethylamine) slowly into the phenol-cyanogen halide (usually chloride in large scale preparation) solution at a temperature between −30 and 20° C. to give almost quantitative cyanation of most phenols. Exceptions are phenols bearing strong electron-withdrawing groups. Cyanation of aliphatic alcohols, on the other hand, cannot normally be done by the same procedure, due to instability of the aliphatic cyanates at ambient temperatures. Substitution of the β-hydrogen with fluorine in the precursors stabilizes the cyanate esters, thus making direct cyanation feasible. Both organic and inorganic bases can be used in cyanation. Triethylamine is preferred for its relatively high-boiling and low equivalent weight properties in scavenging the acid by-product. Insoluble inorganic bases such as NaOH possess the advantage of initiating the cyanation reaction without participating in other side reactions.

Cyanate-containing oligomers or polymers have been prepared by using the same cyanation method on the polymeric phenols. Polycarbonate dicyanate oligomers have been prepared by cyanation of the phenol-terminated polycarbonates. Poly(arylene-ether-sulfone) dicyanate have been synthesized by reacting the phenol-terminated poly(arylene-ether-sulfone) in chlorobenzene with BrCN and TEA. Cyanation of phenol-containing polymers provides an efficient means of access to cyanate macromonomers; poly(p-hydroxystyrene) for example, has been converted to poly (p-cyanatostyrene).

Other polyphenolic compounds such as the one produced by copolymerization and subsequent hydrolysis of the copolymer of p-isopropenylphenyl acetate and styrene have also been subjected to cyanation to produce atactic cyanate macromonomers. Copolymerization of cyanate-containing vinyl monomers such as p-isopropenylphenyl cyanate with long-chain acrylates provides an alternative to the hydrolysis-cyanation approach.

Oligomeric cyanate esters requiring temperatures above 60° C. to flow easily are usually recovered by precipitation from water-miscible solvents, e.g. acetone or tetrahydrofuran, by addition of water or ice. The hard resin products are either washed in water and dried in air or dissolved in low boiling solvents such as methylene chloride and spray dried. Additional monomers useful in synthesizing the cyanurate polymers of the invention include those provided below.

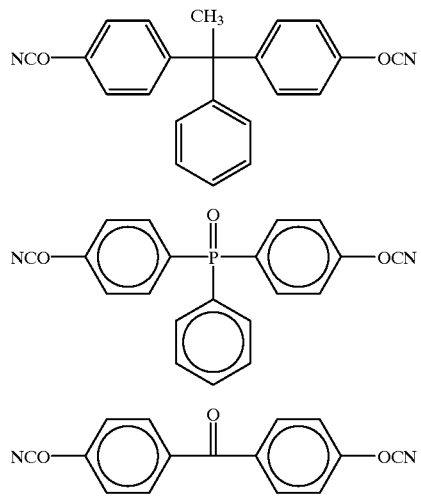

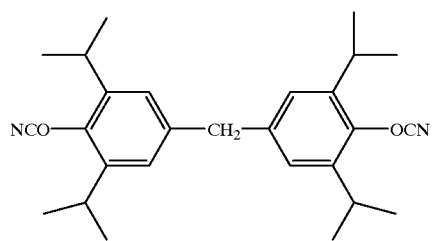
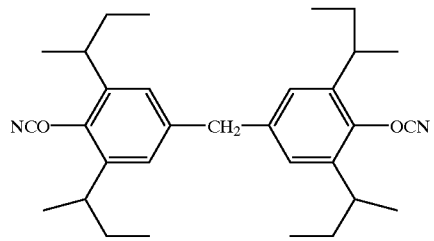
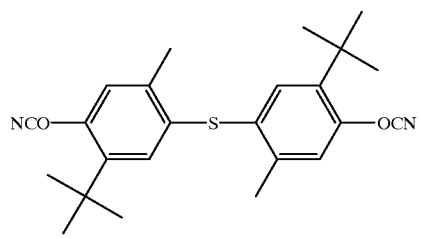
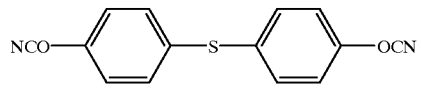
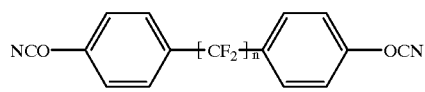
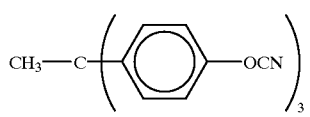
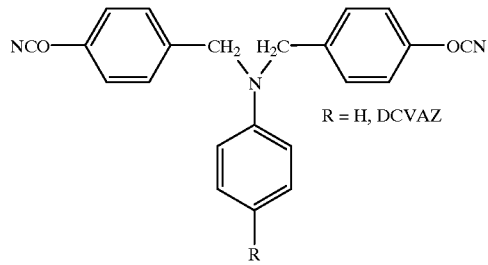
R = H, DCVAZ
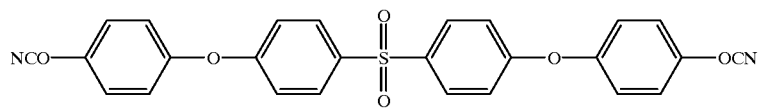
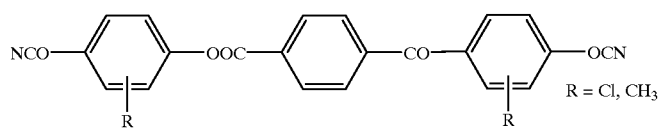
R = Cl, CH₃
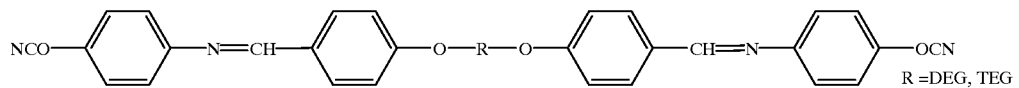
R = DEG, TEG -continued

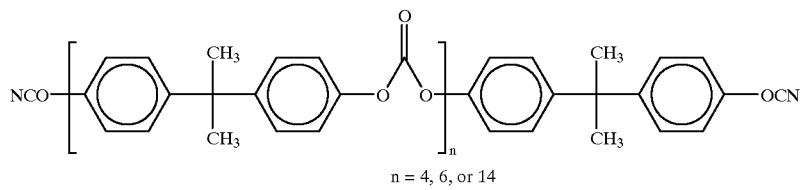

n = 4, 6, or 14

PROCESSING

The porous thermosetting dielectric composition is formed in a three step process. The first step involves dissolving thermosetting polymers in a suitable high boiling solvent (e.g., mesitylene, o-dichlorobenzene, cyclopentanone, gamma-butyrolactone, PM-acetate, N-methyl-2-pyrrolidone, NMP etc.) at room temperature and then uniformly dispersing in the solution a suitable decomposable polymer. The decomposable polymer is radiation decomposable or preferably thermally decomposable. The radiation decomposable polymer decomposes upon exposure to radiation e.g., ultraviolet, x-ray, electron beam or the like. The thermally decomposable polymer undergoes thermal decomposition at a temperature above the condensation temperature of the organic thermosetting materials.

Suitable decomposable polymers include linear polymers, cross-linked polymeric nanospheres, and block copolymers and hyperbranched polymers. Suitable linear polymers are polyethers (such as polypropylene oxide), polyacrylates such as poly(methyl methacrylate), polyisocyanurates, aliphatic polycarbonates (e.g., α-polypropylene carbonate), polyethylene carbonate, polyesters, polysulfones and polystyrene or poly (α methyl styrene). The decomposable linear polymer will preferably have reactive end groups which will react (co-condense) with the organic thermosetting compounds.

Suitable cross-linked, insoluble nanospheres (prepared as nanoemulsions) are suitably comprised of polystyrene or poly(acrylates) and other vinyl polymers. Suitable block copolymers are poly(styrene-ethylene oxide), poly(ether-lactones), poly(ester-carbonates) and poly(lactone-lactide). These block copolymers self organize to form micelles.

Suitable decomposable polymers are also those which also actively promote templating of the vitrification reaction, those which control and define pore size, and those which are fugitive at the appropriate time in the processing. Polymers which have been found preferable include those having an architecture which provides a more three-dimensional structure including block copolymers such as diblock, triblock, and multiblock copolymers; star block copolymers; radial diblock copolymers; graft diblock copolymers; cografted copolymers; dendrigraft copolymers; tapered block copolymers; and combinations of these polymeric architectures; among others.

Suitable hyperbranched polymers are dendrimers, hyperbranched polyesters, e.g., hyperbranched poly (caprolactone), polyethers e.g., polyethylene oxide polypropylene oxide. Organic hyperbranched polymers are highly branched, three-dimensional, globular-shaped macromolecules which have reactive groups at the chain ends with a substantial number of reactive groups along the outer surface of the macromolecule. Preferably, the surface reactive groups are condensable either before or after functional group transformation with the organic thermosetting polymer. Hyperbranched polymers are formed by polycondensation of a multifunctional monomer (A) $RB_n$ wherein A is a coupling group which is reactive with B, R is nonreactive organic spacer and n>1 preferably n=2–5 and more preferably n=2–4.

Preferably the decomposable polymer comprises a copolymer having star architecture. Copolymers having star architecture are characterized by a nuclear configuration which is surrounded by an assortment of arms or branches radiating out from the nuclear center of the copolymer. The nuclear center of the copolymer may be an atom, a moiety, or a monomer unit, among other alternatives.

Star copolymers have been found preferred for a number of reasons. First, we have found copolymers with star architecture are easily processable in synthesis and application. However, more importantly, we have found that copolymers having star architecture provide superior correlation between the volume of copolymer charged into the systems and the ultimate pore size and pore density of the matrix. We have found that copolymers with star architectures form nanoscopic domain sizes allowing for an almost homogenous distribution. Additionally, copolymers with a star architecture tend to inhibit coalescence which would lead to macroscopic phase separation. As a result, the copolymer forms discrete isolated volumes throughout the matrix. Copolymers with a star architecture form the most regular discrete isolated volumes, providing the most predictable pore sizes.

A characteristic of these copolymers generally is controllable complex, compact molecular geometries. The domain size of the copolymer preferably can be correlated to the ultimate pore size obtained. That is the volume of copolymers charged combined with copolymer domain size correlates to the ultimate pore size. Preferably, the pore size is less than about 500 Å, more preferably less than about 100 Å, and most preferably about 30 Å to 80 Å. This smaller pore size allows the application of a more consistent environment from device to device.

Hyperbranched and dendrimeric polymers have low solution and melt viscosities, high chemical reactivity due to surface functionality, and enhanced solubility even at higher molecular weights. Suitable decomposable hyperbranched polymers and dendrimers for use in the present invention will be known to those skilled in the art such as disclosed in "Comprehensive Polymer Science", 2nd Supplement, Aggarwal, pages 71–132 (1996), the disclosure of which is incorporated herein by reference for all purposes.

In the second step of the process of the present invention, the mixture of the organic thermosetting resin and decomposable polymer is heated to an elevated temperature e.g., directly or in a step wise fashion (e.g., 200° C. for 2 hrs. and then ramped up (5° C./min.) to 300° C. and held for 2 hrs.) to cause condensation of the organic thermosetting resin and preferably cross condensation with the reactive groups of the thermally decomposable polymer. The heating in the second step is below the thermal decomposition temperature of the decomposable polymer. A catalyst may be utilized to lower the condensation temperature.

The last step of the process of the invention involves decomposing the decomposable polymer uniformly dispersed within the matrix of the condensed rigid organic thermosetting resin. Photochemical labile polymers can be decomposed by exposure of the composition to suitable radiation to cause photodecomposition. Thermally decomposable polymer is decomposed by heating the composition to a temperature at or above the thermal decomposition temperature of the polymer. (e.g., about 350–400° C.) to produce monomer and/or low molecular weight fragments.

The decomposable polymer decomposes to volatile fragments which diffuse out of the rigid thermosetting resin matrix leaving voids behind. The pore size in the thermosetting resin matrix will be generally the same size as the size of the domains of the decomposable polymer and the pore size and distribution can be altered by varying the molecular weight and the loading level of the decomposable polymer.

The pores generally comprise about 10 to 40 vol-%, preferably about 25 vol-% or less, and more preferably about 20 vol-% or less of the matrix. The molecular weight (Mn) of the decomposable polymer is about 20,000 or less, preferably about 10,000 or less, more preferably about 5,000 or less.

The dielectric composition of the invention has a dielectric constant less than 3.2 and preferably less than 2.8 at 25° C. The composition comprises about 10 to 40% by volume of pores and has pore sizes of less than 1000 Å, preferably less than 500 Å, which result in enhanced mechanical toughness and crack resistance and isotropic optical properties and improved dielectric properties. Generally polymers having a DP of about 4 to 6 provide domains of about 100 Å or less, DP's of 20 to 30 provide domains of about 250 Å to 750 Å, and DP's of 30 or greater provide macrophase separation.

Further the dielectric composition has mechanical properties that resist cracking and enable it to be chemically/mechanically planarized to facilitate lithographic formation of additional circuit levels in multilevel integrated circuit devices. The dielectric composition has a dielectric strength from 1–5 MV/cm. The dielectric composition is optically clear and adheres well to itself and other substrates. The dielectric composition undergoes minimal shrinkage after removal of the casting solvent during heating. The composition of the present invention can also be utilized as a protective coating for optical articles such as glasses, contact lens and solar reflectors and other articles used in outer space.

Figure 2:
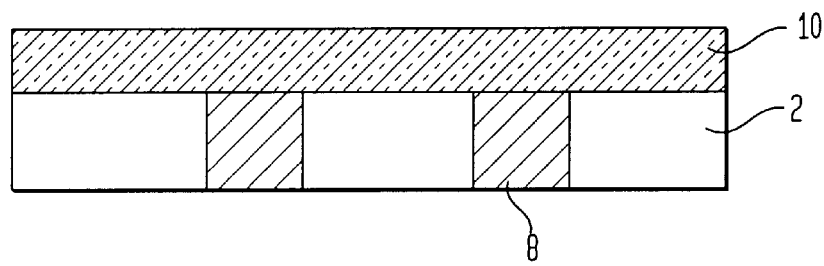
FIGS. 2–5 show a process for making the integrated circuit device of the present invention.

The invention relates to processes for manufacturing the integrated circuit device. Generally, the resin may be processed by conventionally mixing, spinning and heating for application. Referring to FIG. 2, the first step of one process embodiment involves disposing on a substrate 2, a layer 10 of the dielectric composition of the invention comprising organic thermosetting resin and decomposable polymer. The substrate 2 is shown with vertical metallic studs 8. The composition is dissolved in a suitable solvent such as PM-acetate, γ-butyrolactone, dimethyl propylene urea (DMPU), NMP or the like and is applied to the substrate by art known methods such as spin or spray coating or doctor blading.

The second step of the process involves heating the composition to an elevated temperature to cross condense the thermosetting resin reactive groups. The last step involves decomposing the decomposable polymer dispersed within the porous thermosetting resin matrix to form the porous organic polymer.

Figure 3:
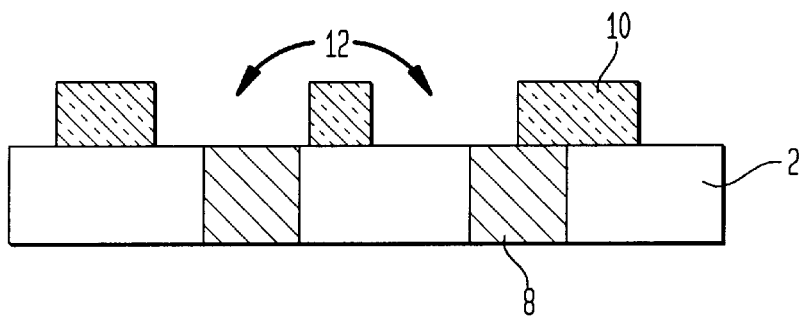

Referring to FIG. 3, the next step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., visible UV or deep UV, (iii) developing the image in the resist e.g., with suitable basic developer and (iv) transferring the image through the layer 10 of dielectric composition to the substrate 2 with a suitable transfer technique such as reactive ion etching, (RIE). Suitable lithographic patterning techniques are well known to those skilled in the art such as disclosed in "Introduction to Microlithography", Thompson et al., (994), the disclosure which is incorporated herein by reference for all purposes.

Figure 4:
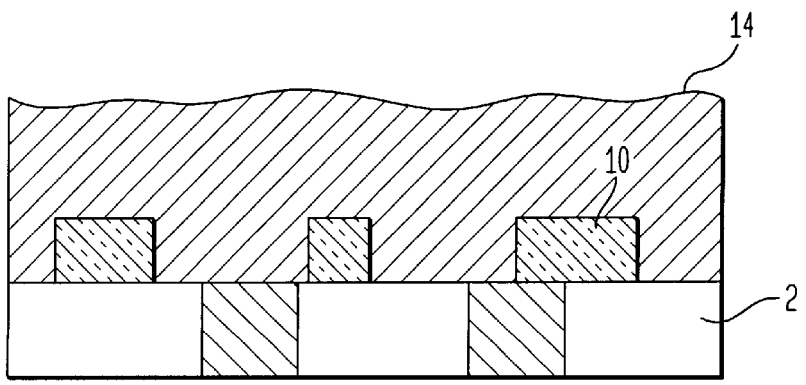

Referring to FIG. 4, in the next step of the process for forming the integrated circuit of the present invention, a metallic film 14 and removing excess metal) is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
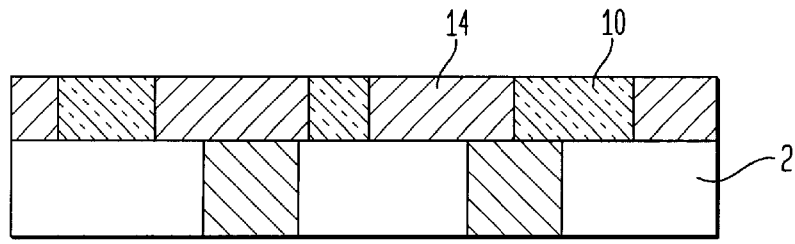

Referring to FIG. 5, the last step of the process involves removal of excess metallic material (e.g., planarizing the metallic film 14) so that the features 14 are generally level with the patterned dielectric layer 10. Planarization can be accomplished using chemical/mechanical polishing or selective wet or dry etching. Suitable chemical/mechanical polishing techniques will be known to those skilled in the art.

Figure 6:
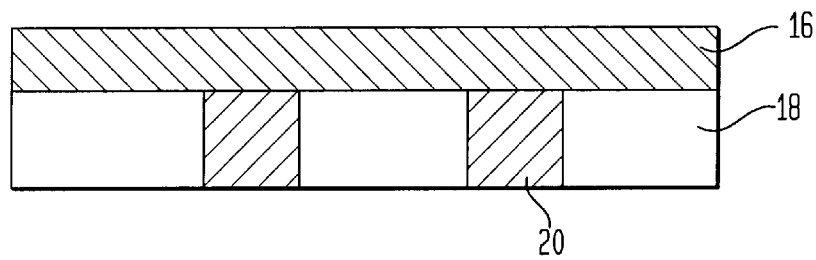
FIGS. 6–8 show an alternative process for making the integrated circuit device of the present invention.
Figure 7:
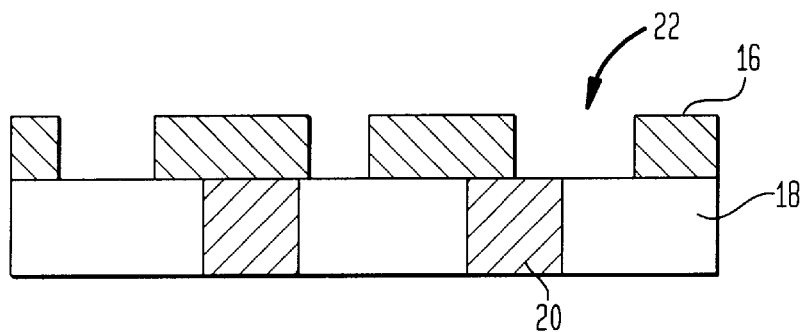
Figure 8:
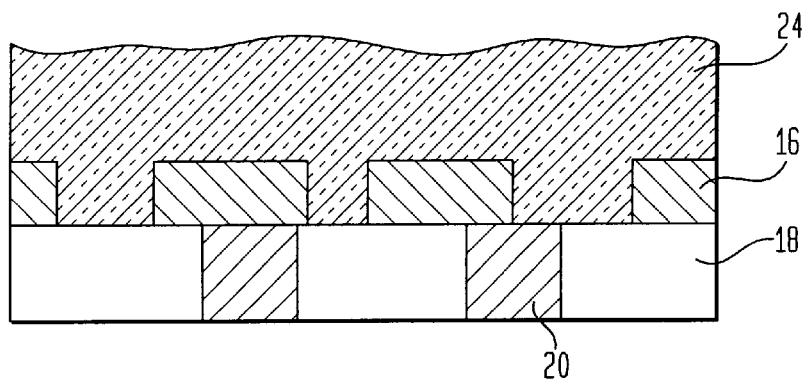

Referring FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the next step of the process, a layer 24 of dielectric composition of the present invention is deposited onto the patterned metallic film 16. In the last step of the process, the composition is heated first to condense the thermosetting material and then at a higher temperature to decompose the thermally decomposable polymer. Optionally, the dielectric layer may then be planarized for subsequent process in a multilayer integrated circuit.

WORKING EXAMPLES

The following examples are detailed descriptions of the process of the invention. The detailed preparations fall within the scope of, and serve to exemplify, the more generally described methods set forth above. The examples are presented for illustrative purposes only, and are not intended as a restriction on the scope of the invention.

A vitrifying matrix is produced from 9,9(bis-3',4'-phenylethynyl), fluorene either alone or in concert with other poly(phenylethynyl) substituted monomers, is normally B-staged to a soluble low molecular weight material before spin coating and final curing. Other candidates include polyarylene ethers derived from 2,2'-(bis-phenylethynyl)-5,5'-dihydroxybiphenyl as described as disclosed in PCT Patent Application WO 97/01593 published Jan. 16, 1997, which is incorporated herein by reference.

The candidates employing the described biphenyl derivative are not limited to fluorinated arylenes but can be extended to any other polyarylenes, polybenzazoles, polyquinolines, polyquinoxalines etc. which can be produced by aromatic nucleophilic condensation polymerization.

Alternatively polyarylene ethers can be prepared by metal-catalyzed coupling as reported in U.S. Pat. No. 5,658,994. The invention is not restricted to the biphenyl derivative but may be applied to any polyethynyl functionalized aromatic di-or poly-ol mercaptan-amine etc. The functionalized porogen can be mixed in solution with any polymers prepared as described above with thermosetting material prior to and after B-staging the resin. The only requirement is that the thermosetting reaction must be significantly advanced prior to the final decomposition of the porogen. Since the later occurs above 300° C. and often above 350° C. this is not viewed as a significant limitation.

Although this invention has been described with respect to specific embodiments, the details thereof are not to be construed as limitations for it will be apparent that various embodiments, changes, and modifications may be resorted to without departing from the spirit and scope thereof and it is understood that such equivalent embodiments are intended to be included within the scope of this invention.

What is claimed is:

1. A process for forming an integrated circuit comprising:
   (a) positioning on a substrate a layer of dielectric composition, the composition comprising decomposable polymer and thermosetting resin;
   (b) heating the composition to condense the thermosetting resin;
   (c) decomposing the decomposable polymer
   (d) lithographically patterning the dielectric layer;
   (e) depositing a metallic film onto the patterned dielectric layer; and
   (f) planarizing the film to form the integrated circuit.

2. The process of claim 1 wherein the decomposable polymer is decomposed by heating or exposure to radiation.

3. The process of claim 2 wherein the organic thermosetting resin comprises a polyarylene.

4. The process of claim 2 wherein the thermosetting resin is selected from the group consisting of a polyimide, a polyarylene, a polyarylene ether, a polybenzazole, a polyisocyanurate, and mixtures thereof.

5. The process of claim 2 wherein the decomposable polymer is a linear polymer selected from polyester, polystyrene, poly(a-methylstyrene), polyacrylate or polymethacrylate.

6. The process of claim 2 wherein the decomposable polymer is a cross-linked polymeric nanosphere.

7. The process of claim 2 wherein the decomposable polymer is hyperbranched polymer.

8. The process of claim 7 wherein the hyperbranched polymer is a polyester.

9. The process of claim 1 wherein the decomposable polymer is a star branched polymer.

10. The process of claim 1 wherein the decomposable polymer is selected from the group consisting of a block copolymer, a star block copolymer, a radial diblock polymer, a graft diblock copolymer, a comb grafted copolymer, a dendigraft copolymer, a tapered block copolymer, and mixtures thereof.

11. A process for forming an integrated circuit comprising:
    (a) depositing a metallic film on a substrate;
    (b) lithographically patterning the metallic film;
    (c) depositing on the patterned metallic film, a layer of a dielectric composition comprising decomposable polymer and organic thermosetting resin;
    (d) heating the composition to condense the organic thermosetting resin comprising a polyarylene ether; and
    (e) decomposing the decomposable polymer.

12. The process of claim 11 wherein the decomposable polymer is decomposed by heating or exposure to radiation.

13. The process of claim 11 wherein the organic thermosetting resin comprises a polyarylene.

14. The process of claim 11 wherein the thermosetting resin is selected from the group consisting of a polyimide, a polyarylene, a polyarylene ether, polybenzazoles, a polyisocyanurate, and mixtures thereof.

15. A process of claim 12 wherein the decomposable polymer is a linear polymer selected from polyester, polystyrene, poly(a-methylstyrene), polyacrylate or polymethacrylate.

16. The process of claim 12 wherein the decomposable polymer is a cross-linked polymeric nanosphere.

17. The process of claim 11 wherein the decomposable polymer is hyperbranched polymer.

18. The process of claim 17 wherein the hyperbranched polymer is a polyester.

19. The process of claim 1 wherein the decomposable polymer is a star branched polymer.

20. The process of claim 11 wherein the decomposable polymer is selected from the group consisting of a block copolymer, a star block copolymer, a radial diblock copolymer, a graft diblock copolymer, a comb grafted copolymer, a dendigraft copolymer, a tapered block copolymer, and mixtures thereof.

* * * * *

UNITED STATES PATENT AND TRADEMARK OFFICE
CERTIFICATE OF CORRECTION

PATENT NO.   : 6,093,636
DATED        : July 25, 2000
INVENTOR(S)  : K. L. Carter et al.

It is certified that error appears in the above-identified patent and that said Letters Patent is hereby corrected as shown below:

Column 4,
Formula II,

Formula III,

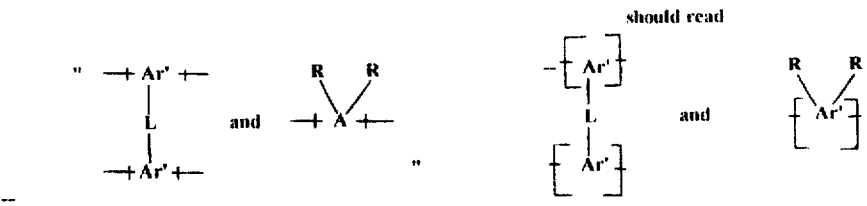

Column 6,
Line 26, "3hexafluoropropene" should read -- 3 hexafluoropropene --
Line 59, (a), "on e" should read -- one --
Line 59, (a), "ortho" should be italicized.

UNITED STATES PATENT AND TRADEMARK OFFICE
CERTIFICATE OF CORRECTION

PATENT NO.    : 6,093,636
DATED         : July 25, 2000
INVENTOR(S)   : K. L. Carter et al.

It is certified that error appears in the above-identified patent and that said Letters Patent is hereby corrected as shown below:

Column 24, claim 10,
Line 12, "diblock polymer" should read -- diblock copolymer --

Column 24, claim 11,
Line 24, delete "organic thermosetting resin comprising a"

Signed and Sealed this

Eleventh Day of December, 2001

Attest:

NICHOLAS P. GODICI
Attesting Officer
Acting Director of the United States Patent and Trademark Office